(12) United States Patent
Sims et al.

(10) Patent No.: US 7,285,786 B2
(45) Date of Patent: Oct. 23, 2007

(54) HIGH-RESOLUTION SCINTILLATION SCREEN FOR DIGITAL IMAGING

(75) Inventors: Gary R. Sims, Tucson, AZ (US); James J. Cook, Tucson, AZ (US)

(73) Assignee: Spectral Instruments, Inc., Tucson, AZ (US)

( * ) Notice: Subject to any disclaimer, the term of this patent is extended or adjusted under 35 U.S.C. 154(b) by 249 days.

(21) Appl. No.: 11/222,605

(22) Filed: Sep. 9, 2005

(65) Prior Publication Data

US 2007/0057195 A1    Mar. 15, 2007

(51) Int. Cl.
*H01J 37/244* (2006.01)
*H01J 37/26* (2006.01)

(52) U.S. Cl. .................. 250/397; 250/311; 250/368; 250/366; 250/370.11; 250/288; 378/98.8

(58) Field of Classification Search .............. None
See application file for complete search history.

(56) References Cited

U.S. PATENT DOCUMENTS

2005/0089142 A1    4/2005  Marek

2006/0169901 A1 *  8/2006  Nguyen-Huu et al. ...... 250/311

OTHER PUBLICATIONS

M.F. Aimi et al. in Nature Materials, v. 3, pp. 103-105, copy not available.

* cited by examiner

*Primary Examiner*—Jack I. Berman
*Assistant Examiner*—Zia R. Hashmi
(74) *Attorney, Agent, or Firm*—Quarles & Brady LLP

(57) ABSTRACT

The scintillating screen of digital imaging systems used in conventional transmission electron microscopy is discretized and the scintillating material is contained in a cellular structure having a geometry judiciously selected for coupling to the optical channels of the imaging system. This allows optical matching, without smearing, between the elements of the scintillating screen and the discrete light-collecting and light-registering optical channels of the system. Cross-talk among optical channels is consequently minimized and the resulting light-imaging resolution of the digital imaging system is optimized.

31 Claims, 9 Drawing Sheets

HIGH-RESOLUTION SCINTILLATION SCREEN FOR DIGITAL IMAGING

BACKGROUND OF THE INVENTION

1. Field of the Invention

This invention is related in general to the field of optical screens. In particular, it relates to scintillation screens converting high-energy electrons to photons used in transmission electron microscopy.

2. Description of the Related Art

Modern digital imaging systems are built around well-known charged-coupled-device (CCD) detectors possessing high sensitivity, wide dynamic range and speed, and providing direct access to output digital data. Certain applications, however, cannot use CCDs for direct detection of the flux of particles that form the image. For example, direct CCD registration of high-energy electrons used in transmission electron microscopy (TEM) is not practical due to saturation and even radiation damage to the CCDs induced by the electron flux. This is why conventional CCD-based systems for detection of high-energy particles primarily rely on energy conversion that precedes the detection step. The conversion is typically achieved with the use of a so-called scintillator, which is a layer of appropriate material—such as one of the specific phosphors used in the art—that is directly illuminated by the high-energy primary electrons forming the image in the TEM and that generates photons in response to such irradiation. The photons are later relayed to the CCD camera using conventional means, the most common being optical-lens or fiber-optic systems, as seen in FIGS. 1A and 1B. In a typical lens-based system, the scintillating phosphor layer is usually formed and contained separately from the optics, as shown in FIG. 1A, while in fiber-optic (FO) based systems it is usually deposited directly on an appropriately prepared input surface of the FO bundle, as seen in FIG. 1B.

In either conventional implementation, however, a serious practical problem arises from the use of a scintillating (phosphor) layer. When penetrating through the phosphor, the fast electrons are being randomly scattered as they generate light and deviate from their original paths. As a result, the spatial extent of photon distribution generated by any electron in the scintillator is significantly larger than the original electron distribution (which is basically a delta-function), leading to a worsening of image resolution during the step of electron-to-photon conversion. This process is illustrated in the FO-based system of FIG. 2, where multiple channels feed each pixel. As shown in the figure, the light distribution L significantly exceeds the extent of a single FO channel, as each electron e⁻ impinging on the scintillating layer S delivers corresponding photons to the CCD detector by not one but several FO channels. As a result, several CCD pixels are illuminated by the image of the single electron due to random scattering of the electron (as well as generated X-rays and photons) in the scintillating layer S and overall image resolution is correspondingly decreased. It is clear, therefore, that only when the light distribution L and the CCD pixel have comparable sizes the digital imaging provided by the CCD is optimized.

Therefore, there exists an unresolved need for a system of electron-to-photon energy conversion in a scintillator that does not decrease the image resolution beyond the limit of the subsequent optical train delivering the light to the CCD detector. This invention solves this problem by using a discretized scintillator screen, arranged in pixel-like fashion, where the "pixels" of the screen are cells filled with scintillating phosphor and separated by barriers impenetrable to both primary electrons and the light generated inside the phosphor. As a result, the distribution of the light generated within a given screen cell is controlled by the geometric extent of the cell, and loss of imaging resolution due to electron-to-photon conversion in the scintillator layer is thereby minimized. It is preferred that each screen cell be smaller than a CCD pixel so that the CCD pixel defines the spatial resolution of the imaging system.

BRIEF SUMMARY OF THE INVENTION

The invention consists of discretizing the scintillating screen by structuring it not as a continuous layer of scintillating material but as a set of scintillating cells arranged in a particular cell pattern. The pattern is selected so that it judiciously corresponds to the configuration of discrete elements in the receiving portion of the optical system, such the pattern of CCD pixels or the cross-sectional pattern of FO channels in the input portion of an FO means of light delivery to a CCD detector. As a result of this screen discretization, the light distribution generated in each scintillating cell does not extend beyond that cell, thus minimizing the imaging resolution loss due to scattering. Such a discretized scintillator screen may be fabricated first by creating a cellular structure on an appropriate carrying surface and then by filling the cells with scintillating material.

According to one aspect of the invention, the phosphor-containing cells are fabricated in such a fashion that there is at least a one-to-one optical correspondence between each cell and each imaging channel of the TEM system. For example, in an FO-based TEM system it would be preferable to size the cells to match a single FO channel by forming the cells on the input surface of the FO bundle directly above the FO channels and centering with respect to them. However, such a 1:1 correspondence is impractical to achieve in practice. In a lens-coupled system, the cells may be fabricated in a stand-alone self-supporting structure and judiciously positioned to be optically conjugate with the pixels of the CCD-detector. As a result, the overall light distribution generated in the scintillator is discretized and the number of discrete light "puddles" is made to uniquely correspond to the number of imaging channels and/or number of detecting pixels of the system.

According to another aspect of the invention, all phosphor-containing cells are fabricated from material that either significantly absorbs or reflects photons. As a result, the light generated within the phosphor in each cell is fully contained within the boundaries of the cell, it is blocked from propagating into neighboring cells, and it is directly coupled into and delivered to CCD-detector pixel by corresponding FO channels on top of which the cell has been fabricated. Any cross-talk in the scintillator is therefore avoided, as well as imaging-resolution loss due to light coupling into the optical system.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

DETAILED DESCRIPTION OF THE INVENTION

Conventional digital-imaging systems for TEM are equipped with a phosphor scintillating layer that is continuous along the scintillator screen. In such a system the light produced by a high-energy electron within the phosphor can be generated anywhere the electron impinges upon the scintillator and extends as far away from the point of incidence as the electron randomly scatters within the phosphor. As a result of such electron scatter during the electron-to-photon conversion, the spatial "footprint" of the electron within the phosphor layer increases, laterally distributing generated light far beyond the vicinity of the point of incidence of the electron and smearing the light-image of incident electron. Therefore, the corresponding light-image resolution is decreased in comparison to the original electron-image of the sample. This invention provides a cellular scintillator screen that prevents such imaging degradation.

By using a scintillating screen in cellular configuration, the light generated within each cell is coupled directly to corresponding imaging channels of the system and delivered through those channels to a predetermined pixel (or set of pixels) of a CCD detector. This physical and optical pairing of scintillator cells and corresponding image-forming channels of the TEM system limits the off-axis distribution of the light produced by each electron within the scintillator to the dimension of the cell, which is matched in some desirable proportion to the dimension of a corresponding imaging channel. Consequently, the light registration is restricted to a single corresponding pixel of the CCD detector.

The term "opaque" is used in this disclosure to mean not previous to radiant energy, especially light. Conversely, the term "transparent" is used to mean having the property of transmitting light without appreciable scattering. The term "non-transmissive" is used to mean either opaque or reflective, as this term in conventionally used in the art. The term "optical channel" is used to refer to any optical element, such as a lens or a fiber, used to transmit light from the scintillator to the light detector of a system. Finally, the terms "scintillator" and "scintillator material" (or "scintillating material") are used to refer to a material capable of generating visible light in response to incident high-energy electrons or X-ray radiation.

Figure 3:
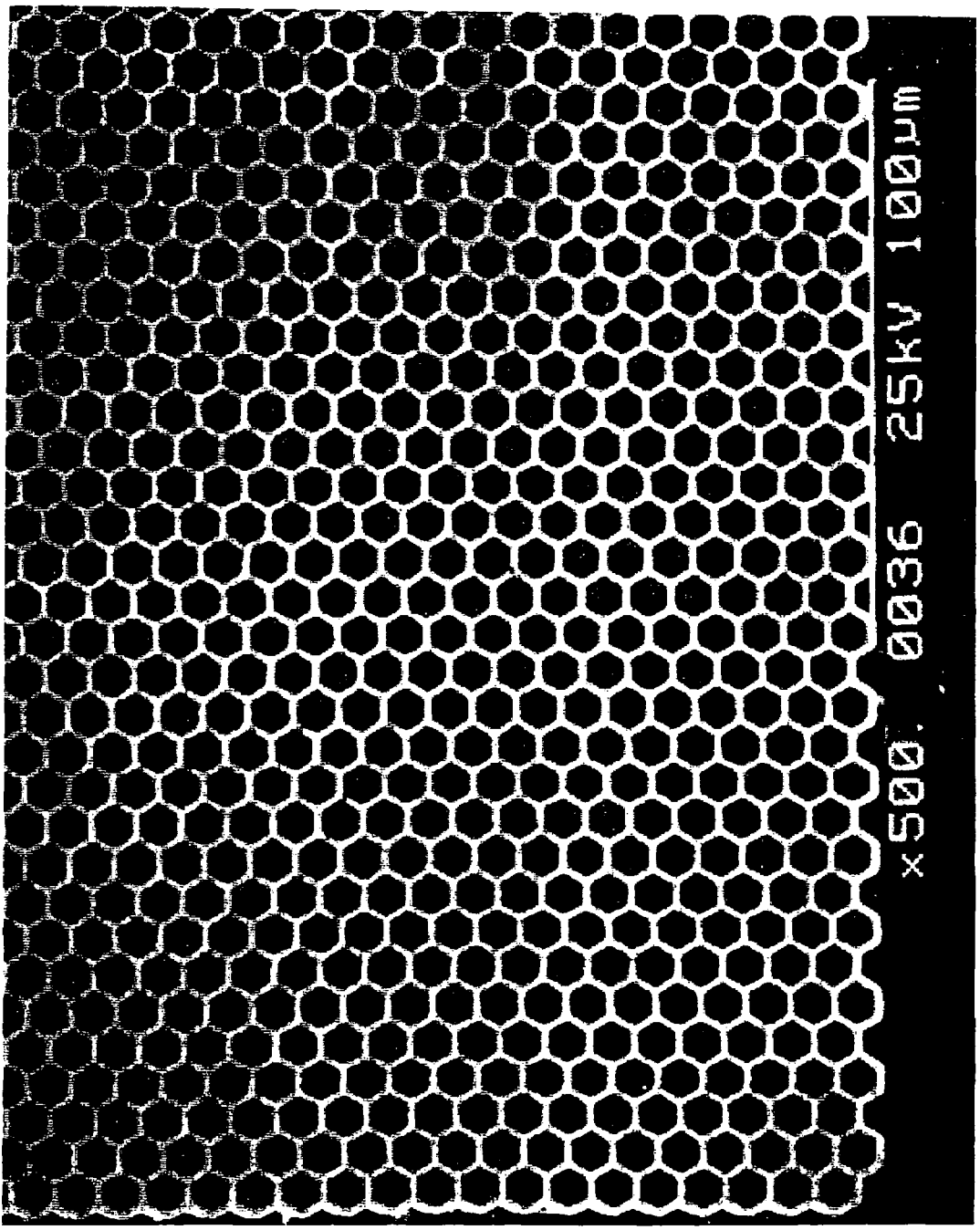
FIG. 3 is a scanning electron microscopy (SEM) image of a cellular scintillator structure according to the invention.
Figure 4:
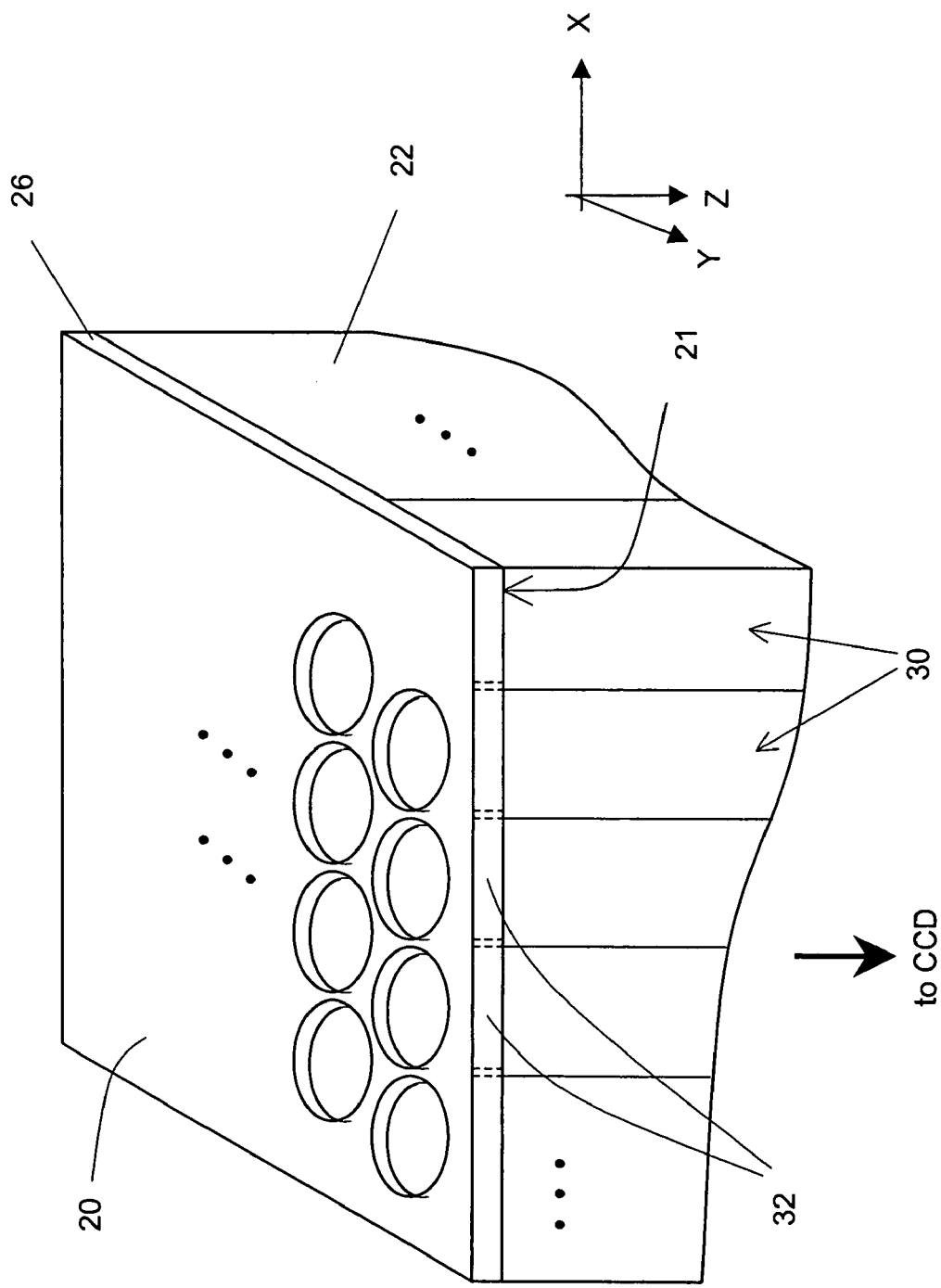
FIG. 4 is a schematic perspective view of a portion of a fiber-optic based imaging system according to the invention.
Figure 5:
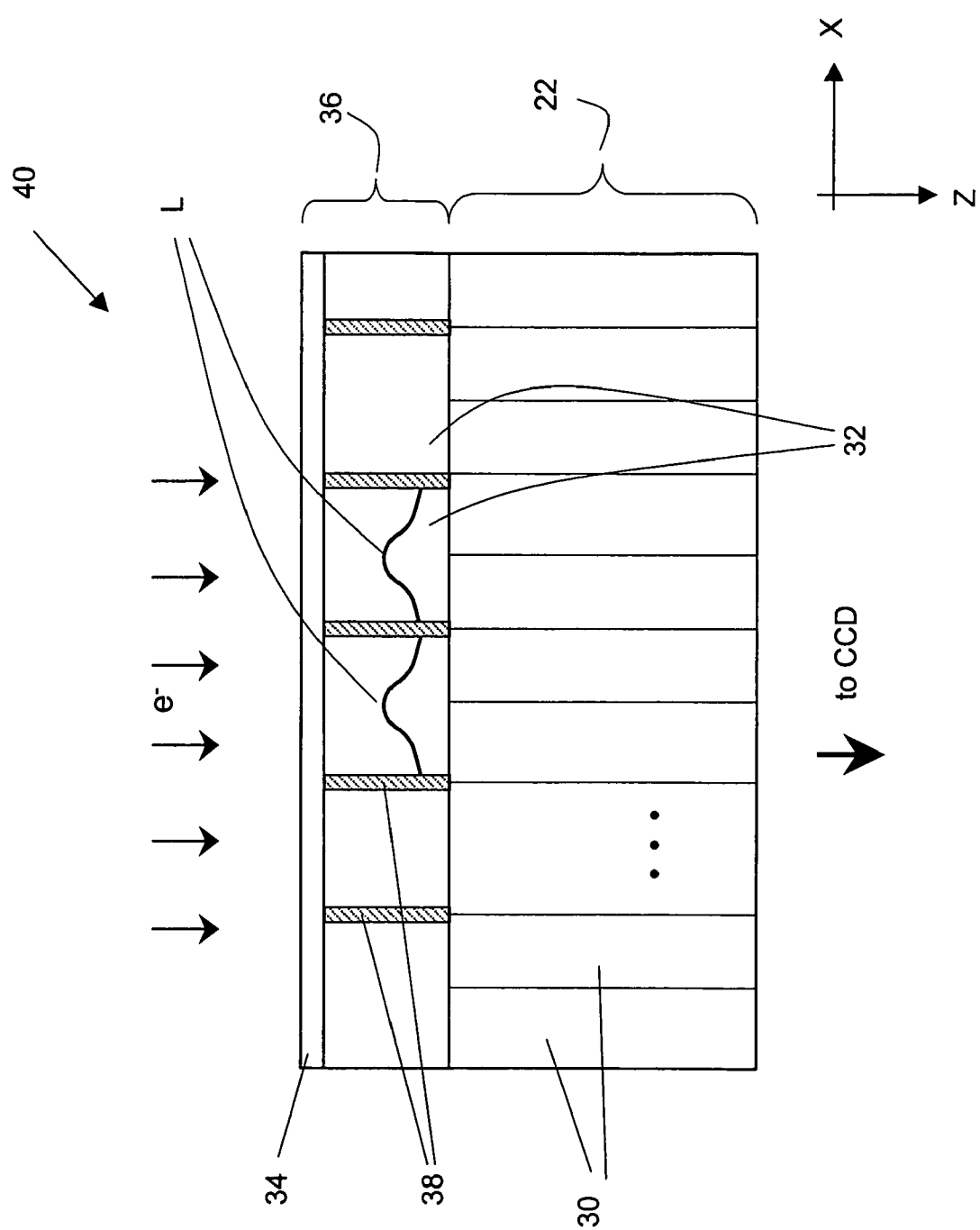
FIG. 5 is an elevational side view of the fiber-optic system of FIG. 4.

Referring to the figures, wherein the same reference numerals and symbols are used throughout to refer to like parts, FIG. 3 is an SEM image of a typical cellular structure used to manufacture a TEM scintillator layer according to the invention. In one embodiment, the scintillator structure is formed in a layer of opaque material. As illustrated in FIGS. 4 and 5, the cellular structure 20 may be fabricated on the input surface 21 of the FO bundle 22 of an FO-based TEM digital imaging system. An appropriately thick film 26 of opaque material (such as titanium—Ti) is first deposited, or otherwise attached, and then a pattern of through-holes 28 in created in the film. The film 26 could also be first patterned and then attached to the input surface 21. The dimensions and the pattern of the holes 28 are preferably selected to match directly the dimensions and the cross-sectional pattern of the FO channels 30 in the FO bundle 22. However, since the diameters of the optical fibers typically used in current TEM systems are about 3 µm to 12 µm, such unique one-to-one correspondence between the holes 28 and channels 30 is difficult to achieve in practice. Therefore, inasmuch as the main concern is directed to ensuring that the system resolution is limited by the CCD pixels (which vary in size between about 9×9 µm$^2$ and 24×24 µm$^2$), the dimensions of the holes 28 are normally chosen to be smaller than the CCD pixels. The film 26 may be formed by various deposition methods well known in the art, such as vacuum deposition; alternatively, a Ti foil may be glued to the surface 21. The through-holes 28 can be produced, for example, by high-aspect bulk micro-machining, as described by M. F. Aimi et al. in Nature Materials, v. 3, pp. 103-105. As a result, a set of cells 32, patterned to uniquely correspond to the pattern of the FO bundle 22, is formed on the top surface 21 of the bundle. The cells 32 are then filled with a scintillating material and may be appropriately covered with a protective, preferably reflective layer 34 (for example, with a thin Al foil) to complete the manufacture of the cellular scintillating screen 36 of the invention (FIG. 5). The purpose of Al foil is not only to reflect back into the cell the photons generated in the phosphor, but also to ground the scintillator and therefore prevent it from becoming electrically charged and repelling the incident electron flux.

Figure 1A:
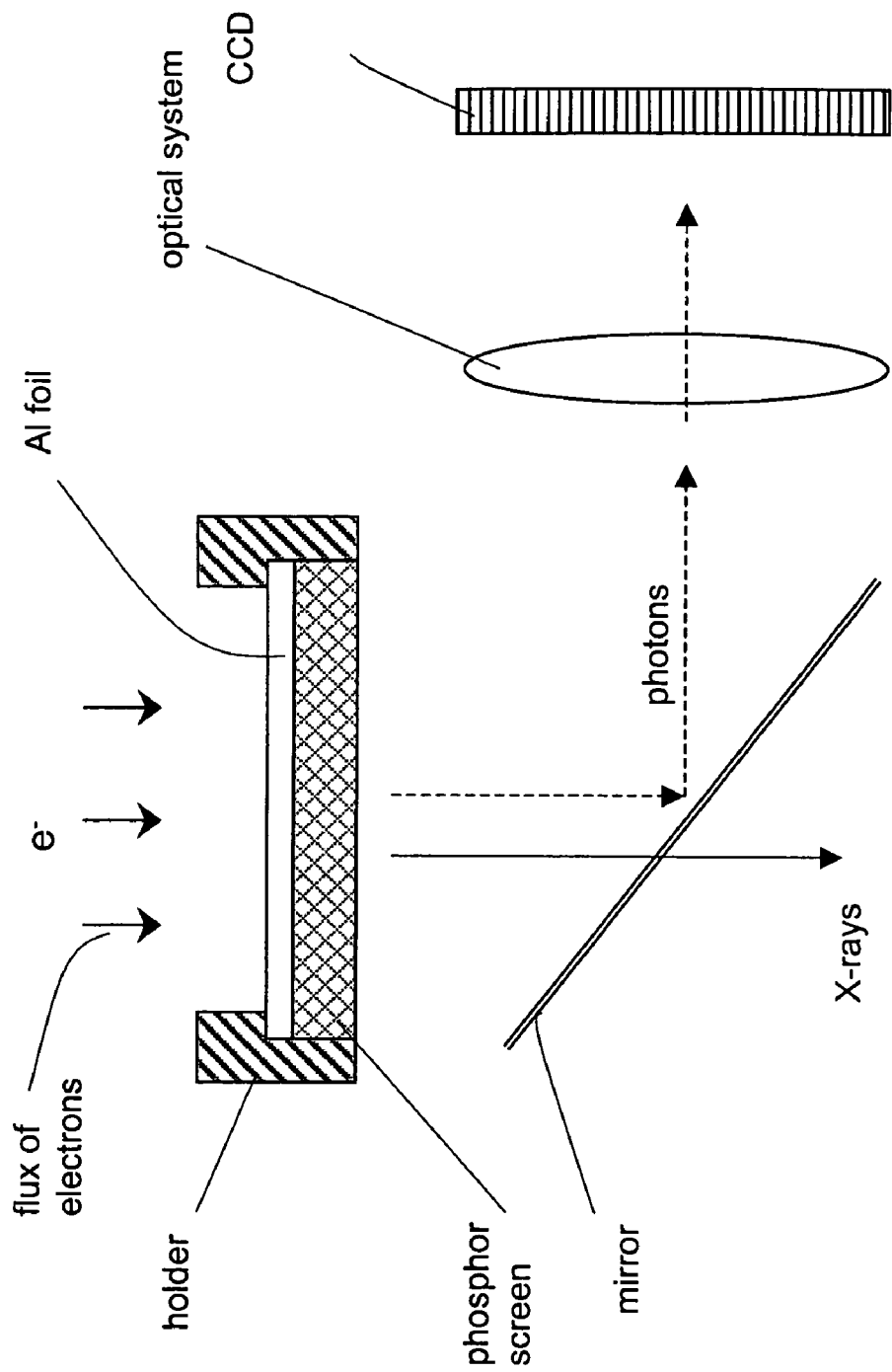
FIG. 1A is a schematic illustration of a conventional lens-coupled CCD imaging system for transmission electron microscopy.
Figure 1B:
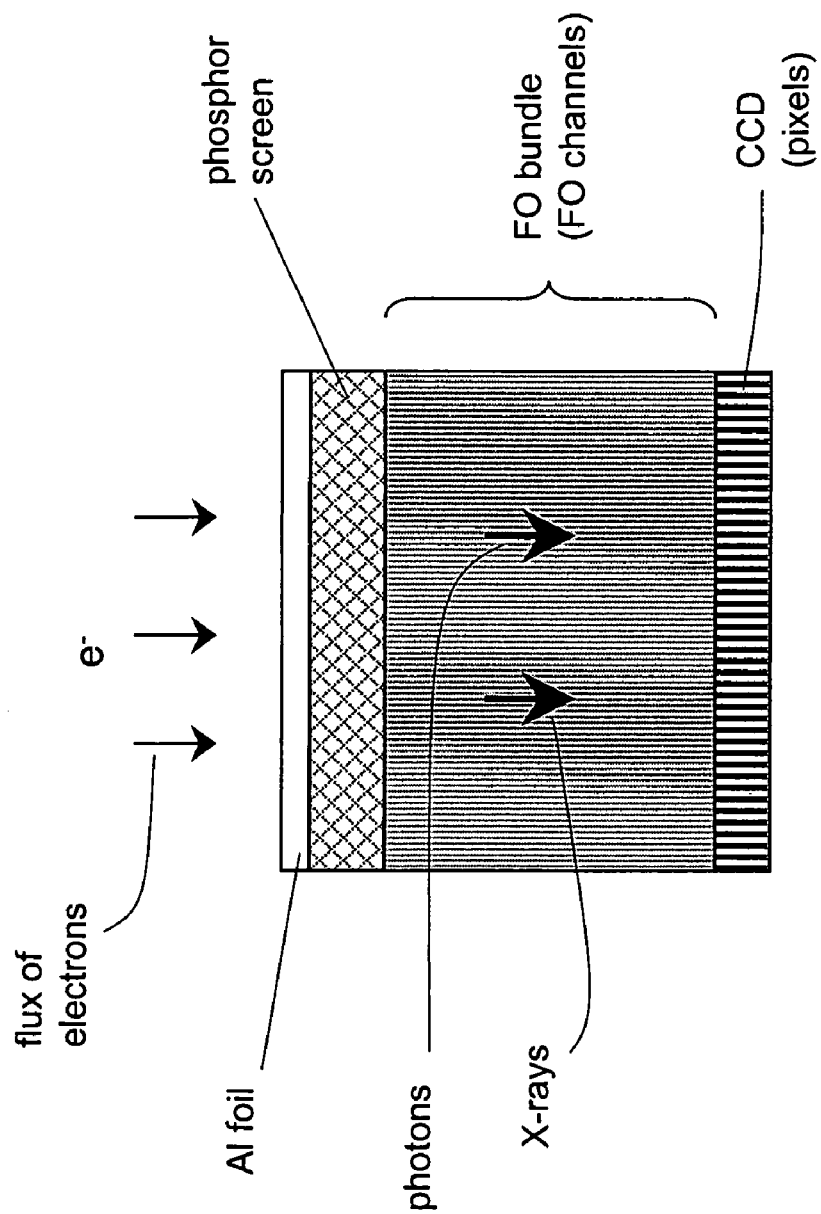
FIG. 1B is a schematic illustration of a conventional fiber-optics coupled system for transmission electron microscopy.
Figure 2:
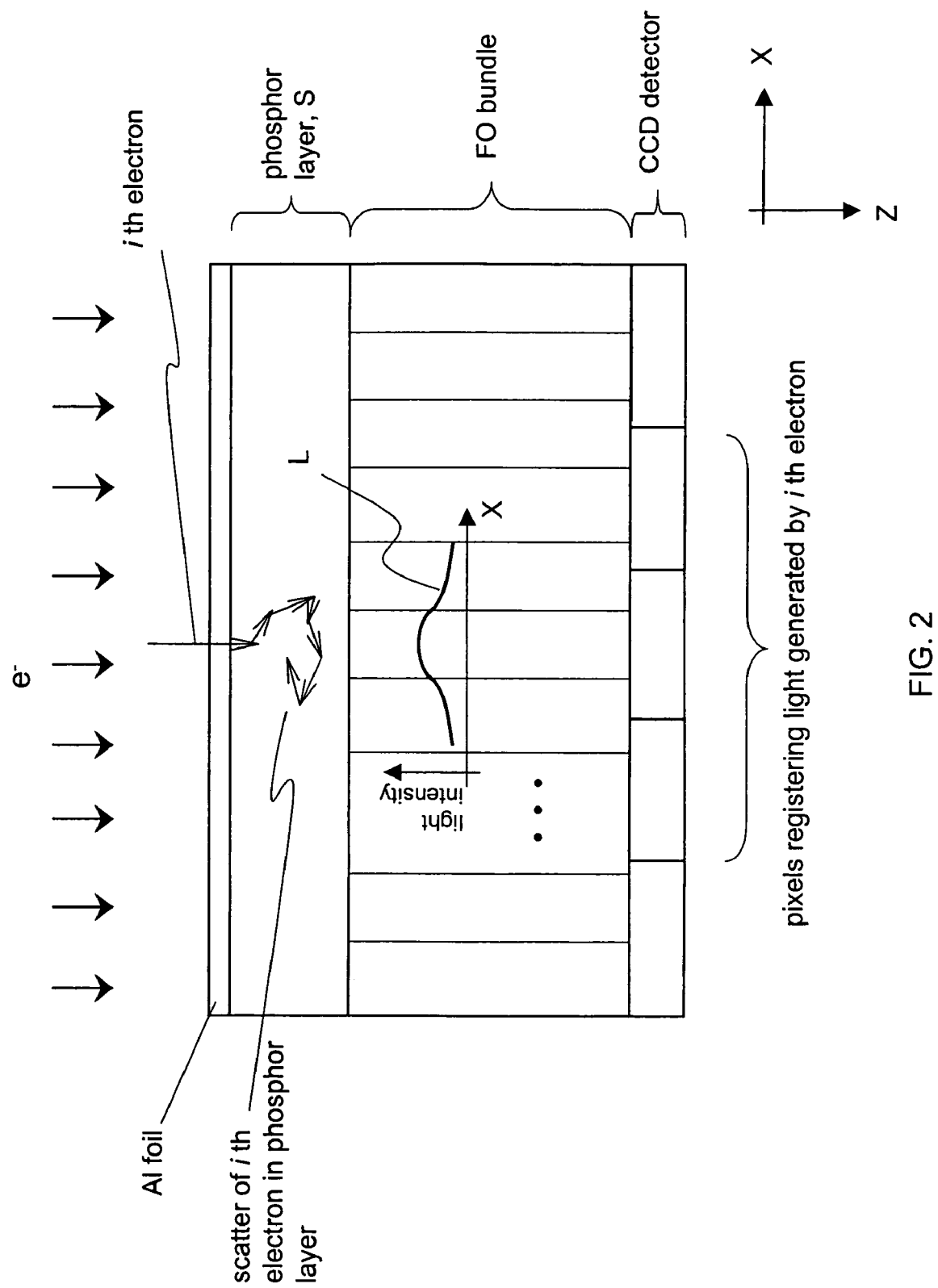
FIG. 2 is a schematic representation of the process of resolution loss occurring upon coupling of light generated in a conventional scintillator by a single electron in a fiber-optic light delivery system.

The cells 32 of the screen are fabricated directly on top of and centered with respect to the corresponding FO channels 30 and are separated from each other by opaque walls 38, as seen in FIGS. 3 and 5. Consequently, the light distribution L generated by the incident flux of electrons e$^-$ in the scintillating material in each cell is prevented from spreading beyond the perimeter of the cell and is coupled directly to the single corresponding FO channel. This eliminates any coupling of the light to multiple FO channels, as compared to the situation illustrated FIG. 2, and correspondingly any cross-talk among FO channels. Therefore, the imaging resolution of the system 40 is optimized. For convenience of illustration, these figures show the scintillator cells coupled to two FO channels, but it is understood that in practice such precise correspondence would be difficult to achieve and therefore unlikely.

Figure 6:
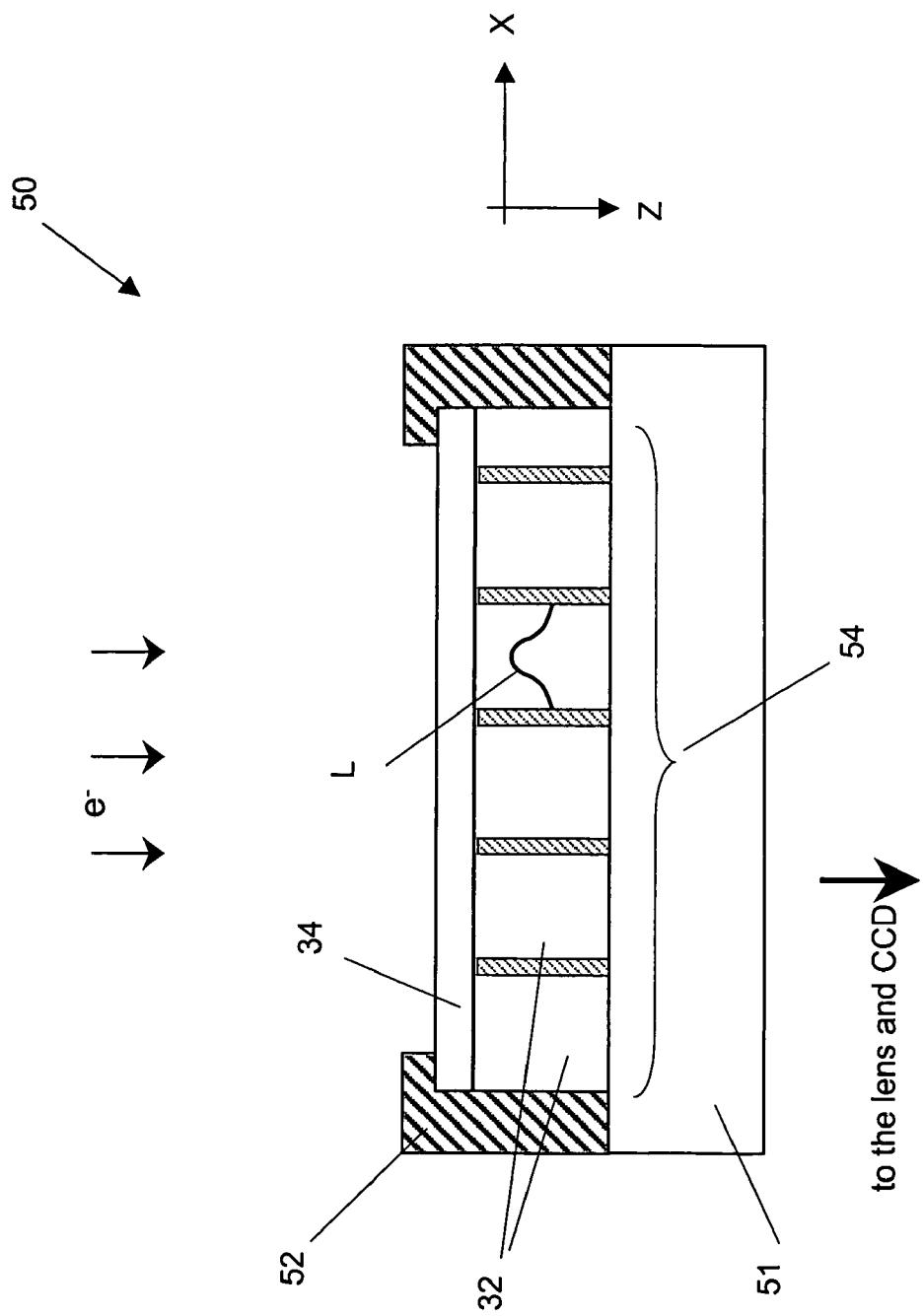
FIG. 6 is a schematic section of the scintillating screen of the invention used in a lens-based TEM.

An alternative embodiment 42 of the invention for a lens-coupled imaging system is illustrated in FIG. 6. A cellular scintillating screen 50 is shown as a stand-alone component comprising a layer of phosphor-bearing cells 32 on a sheet 51 of transparent glass and an aluminum foil 34 structurally supported by an appropriate frame 52. The cells 32 are again formed from opaque material (such as Ti) and judiciously sized to a predetermined correspondence with the dimensions of the CCD-pixels to which they are to be coupled. All cells 32 are preferably distributed uniformly across the screen according to the pixel pattern of the corresponding CCD detector in the TEM system (not shown in FIG. 6). Thus, the light distribution L generated by incident electrons in the phosphor contained within any cell of the structure is completely contained within the cell and is directly imaged by the lens (not shown) onto a uniquely corresponding pixel of the CCD detector (also not shown). As a result, unwanted smearing of the light image over several CCD-detector pixels is eliminated or minimized, as compared to conventional lens-based digital imaging TEM systems.

Figure 7:
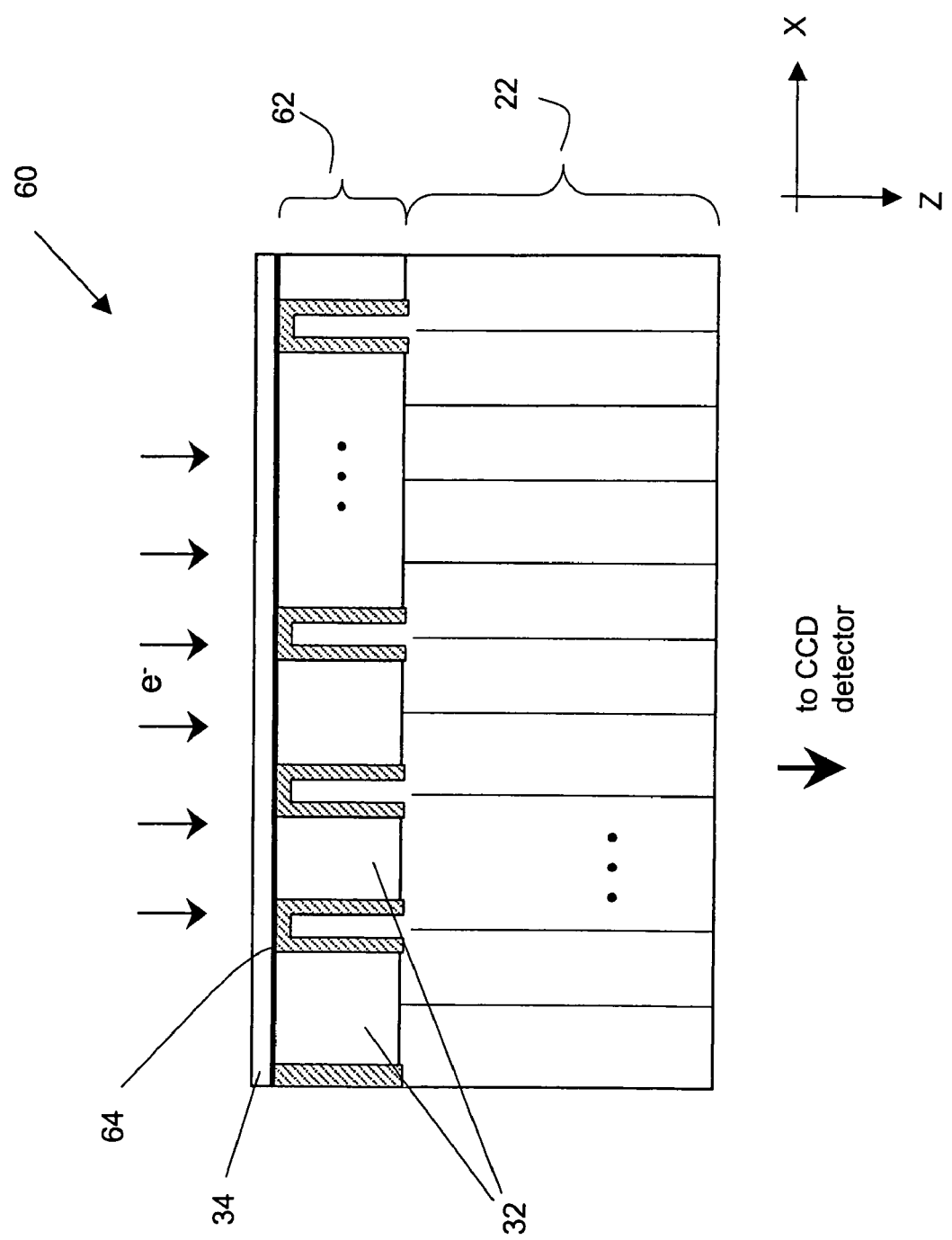
FIG. 7 is an elevational sectional view of an alternative embodiment of the invention used in a fiber-optic based TEM.

It is understood that departures from the description above can be made within the scope of the invention. For instance, CMOS or CID detectors could be used instead of CCDs. Similarly, in an alternative embodiment 60 of the invention shown in FIG. 7, a scintillating-material-bearing cellular structure 62 can be first formed with any suitable material on the input surface 21 of the FO bundle 22 (for example, by etching or high-aspect bulk micromachining processes), and then appropriately overcoated with a film 64 of opaque material (such as Ti). It is also clear that the distribution and size of the cells in the screen of the invention do not have to be uniform throughout the screen, but may be varied to match the configuration of the system's optics or detector, or to meet any other requirement of the system.

Figure 8:
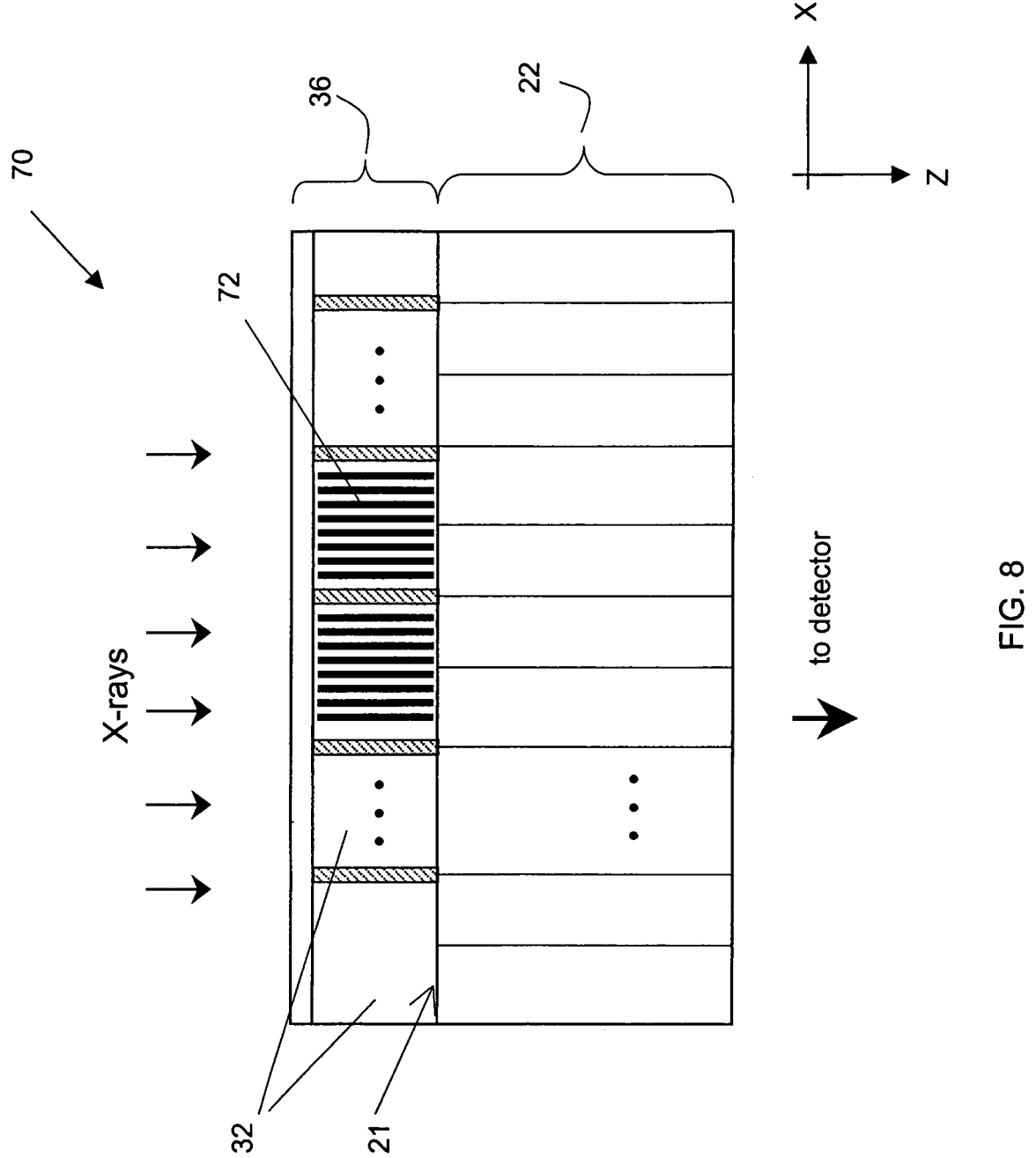
FIG. 8 is an elevational sectional view of an embodiment of the invention used in an X-ray imaging system.

Furthermore, while the invention has been shown and described in the context of conventional transmission electron microscopy, it is recognized that the same concept could be adapted by those skilled in the art to any system wherein a high-energy electron flux or X-ray radiation is converted into photons by a scintillation material. For example, the invention could be practiced in applications involving indirect X-ray imaging with a typical silicon detector (such as a CCD, a CMOS, or a CID detector). In such applications, the scintillator material that converts the incident flux of X rays to photons is pixelated, according to the invention, and the photons are delivered optically from the scintillator to the detector. As illustrated in the system 70 shown in FIG. 8, a pixelated structure 36 of cells 32 is formed with any suitable opaque material (such as Ti) on the input surface 21 of a FO bundle 22 coupled to a detector. (Alternatively, the structure 36 may be formed directly on the input surface of the detector.) As a result, the columnar structure of the cells 36 acts as a scintillating waveguide-like structure that guides the photons generated by the incident flux of X rays within the scintillator 72 of each cell towards the FO bundle 22. Thus, the invention overcomes the prior-art requirement that anisotropic scintillators be used, such as cesium iodide, sodium iodide, zinc sulfide, or calcium fluoride, in the form of long, oriented, needle-like columns, as described in U.S. Publication No. 20050089142. The arrangement of the invention additionally reduces the light scatter within the scintillator of the X-ray imaging system 70 as compared to conventional systems that contain randomly oriented scintillator material.

In view of the foregoing, the invention is not to be limited to the details disclosed herein but is to be accorded the full scope of the claims so as to embrace any and all equivalent processes and products.

We claim:

1. A scintillator device for producing light coupled to an optical imaging system, comprising:

a cellular-screen structure including a plurality of cells, each cell being substantially non-transmissive to light emitted in adjacent cells; and scintillating material contained in each of said plurality of cells;

wherein the cells are patterned and sized to match a predetermined optical-channel configuration in the imaging system.

2. The device of claim 1, wherein said structure is made of non-transmissive material.

3. The device of claim 1, wherein said structure is coated with non-transmissive material.

4. The device of claim 1, wherein each of said cells is coupled to an optical channel of the imaging system.

5. The device of claim 1, wherein more than one of said cells is coupled to an optical channel of the imaging system.

6. The device of claim 1, wherein said cells are uniformly distributed across the cellular-screen structure.

7. The device of claim 1, further comprising a layer of transparent material over said cellular-screen structure.

8. The device of claim 1, further comprising a layer of transparent material over said cellular-screen structure; wherein said structure is made of opaque material,and the cells are uniformly distributed across the cellular-screen structure.

9. The device of claim 1, wherein said scintillator device is used to couple an electron flux to an imaging system of a transmission electron microscope.

10. The device of claim 1, wherein said scintillator device is used to couple X-ray radiation to an X-ray indirect imaging system.

11. A transmission electron microscope comprising:

a scintillator component;

a light-collector component optically coupled to the scintillator; and a light-detector component optically coupled to the light-collector component;

wherein the scintillator component includes a cellular-screen structure with a plurality of cells and scintillating material contained in each cell, each cell being substantially non-transmissive to light emitted in adjacent cells.

12. The microscope of claim 11, wherein the cells are patterned and sized to match a predetermined configuration of optical channels in the light-collector component of the microscope.

13. The microscope of claim 11, wherein said structure is made of non-transmissive material.

14. The microscope of claim 11, wherein said structure is coated with non-transmissive material.

15. The microscope of claim 11, wherein each of said cells is coupled to an optical channel of the light-collector component.

16. The microscope of claim 11, wherein more than one of said cells is coupled to an optical channel of the light-collector component.

17. The microscope of claim 11, wherein said cells are uniformly distributed across the cellular-screen structure.

18. The microscope of claim 11, further comprising a layer of transparent material over said cellular-screen structure.

19. The microscope of claim 11, wherein said light-collector component is a fiber-optic bundle and said light-detector component is a charged-coupled-device detector.

20. The microscope of claim 11, wherein said light-collector component is a fiber-optic bundle and said light-detector component is a cmos detector.

21. The microscope of claim 11, wherein said light-collector component is a lens system and said light-detector component is a charged-coupled-device sensor.

22. The microscope of claim 11, wherein said light-collector component is a lens system and said light-detector component is a cmos sensor.

23. The microscope of claim 11, further comprising a layer of transparent material over said cellular-screen structure; wherein said structure is made of non-transmissive material, said light-collector component is a fiber-optic bundle and said light detector component is a charged-coupled-device detector; each of the cells is coupled to a fiber said fiber-optic bundle; and the cells are uniformly distributed across the cellular-screen structure.

24. The microscope of claim 11, further comprising a layer of transparent material over said cellular-screen structure; wherein said structure is made of non-transmissive material, said light-collector component is a lens system and said light-detector component is a charged-device detector; each of the cells is coupled to a predetermined number of pixels in said charged-coupled-device detector; and the cells are uniformly distributed across the cellular-screen structure.

25. A method for manufacturing a scintillator device for coupling an electron flux to an optical imaging system, comprising the steps of:
providing a layer of solid material;
forming a plurality of through-cells in said layer of solid material to produce a cellular-screen structure, each cell being substantially non-transmissive to light emitted in adjacent cells;
placing scintillating material in each of said plurality of cells; and
coupling the cells to a predetermined optical-channel configuration in the optical imaging system.

26. The method of claim 25, wherein said solid material is non-transmissive.

27. The method of claim 25, wherein said solid material is not non-transmissive and the method includes the further step of coating the cellular-screen structure with non-transmissive material.

28. The method of claim 25, wherein said cells are uniformly distributed across the cellular-screen structure.

29. The method of claim 25, further comprising the step of placing a layer of transparent material over said cellular-screen structure.

30. The method of claim 29, wherein said structure is made of non-transmissive material, said optical-channel configuration includes a fiber-optic bundle; said optical-imaging system includes a charged-coupled-device detector; each of the cells is coupled to a fiber in said fiber-optic bundle; and the cells are uniformly distributed across the cellular-screen structure.

31. The method of claim 29, wherein said structure is made of non-transmissive material, said optical-channel configuration includes a lens system; said optical-imaging system includes a charged-coupled-device detector; each of the cells is coupled to a predetermined number of pixels in the charged-coupled-device detector; and the cells are uniformly distributed across the cellular-screen structure.

* * * * *